United States Patent [19]

Malik et al.

[11] Patent Number: 4,539,581

[45] Date of Patent: Sep. 3, 1985

[54] PLANAR DOPED BARRIER TRANSFERRED ELECTRON OSCILLATOR

[75] Inventors: Roger J. Malik, Little Silver; Gerald J. Iafrate, Toms River, both of N.J.

[73] Assignee: The United States of America as represented by the Secretary of the Army, Washington, D.C.

[21] Appl. No.: 397,340

[22] Filed: Jul. 12, 1982

[51] Int. Cl.³ .................. H01L 27/26; H01L 29/12
[52] U.S. Cl. ........................................ 357/58; 357/3
[58] Field of Search ...................................... 357/3, 58

[56] References Cited

U.S. PATENT DOCUMENTS

| | | | |
|---|---|---|---|
| 3,365,583 | 1/1968 | Gunn . | |
| 4,410,902 | 10/1983 | Malik | 357/4 |
| 4,417,261 | 11/1983 | Gray et al. | 357/3 |

OTHER PUBLICATIONS

*Physics of Semiconductor Devices,* S. Sze, 2nd Ed. 1981, Wiley-Interscience, pp. 667-670 (Discloses Contact Types for TED's).

*Primary Examiner*—Andrew J. James
*Assistant Examiner*—Mark Prenty
*Attorney, Agent, or Firm*—Anthony T. Lane; Jeremiah G. Murray; Edward Goldberg

[57] ABSTRACT

A transferred electron semiconductor device in the form of an oscillator, for example, is fabricated by a molecular beam epitaxy growth process wherein a plurality of semiconductor layers are sequentially grown on a planar substrate. A pair of ohmic contacts are formed on the outer surface of the substrate and the uppermost layer with the resulting structure including two distinct intermediate semiconductor regions, the first being a drift region adapted to exhibit a differential negative resistance due to the transferred electron effect, and the second being a planar doped barrier region for accelerating electrons into the upper valley and injecting them into the drift region. By the use of a planar doped barrier a more uniform electric field is obtained along with a controlled lower barrier height whereby the transfer of electrons to the upper conduction band satellite valley can be made to occur over much shorter times and distances thus extending the upper frequency range of operation.

9 Claims, 4 Drawing Figures

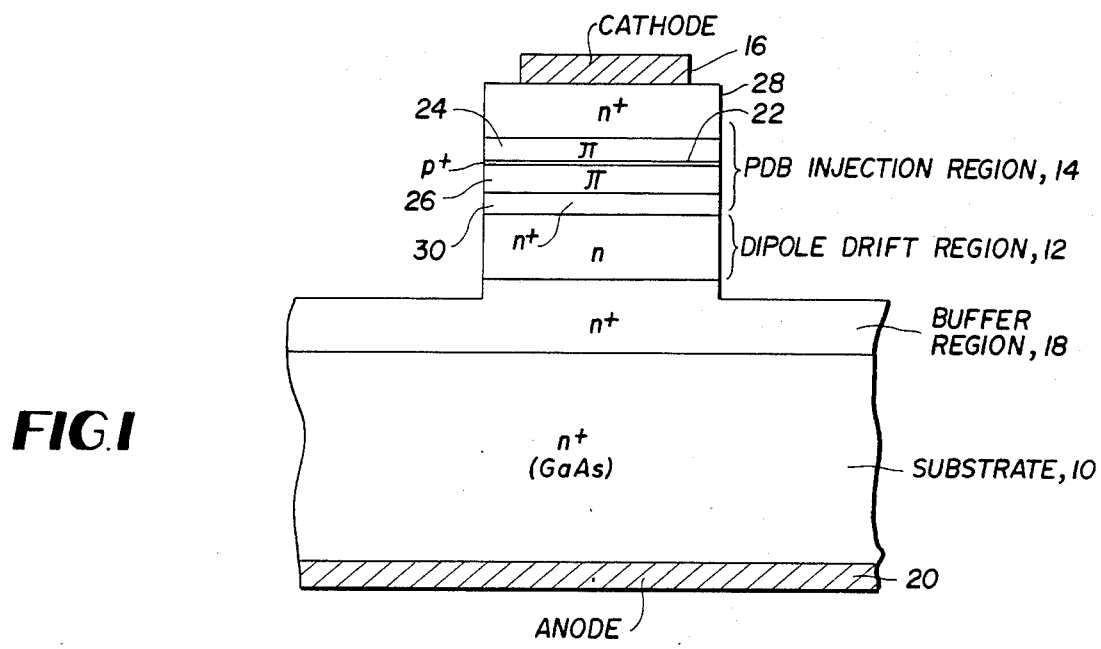
FIG.1
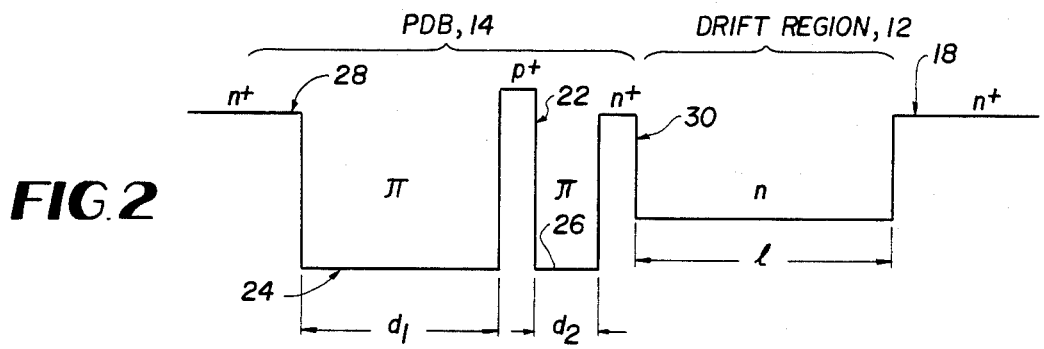
FIG.2
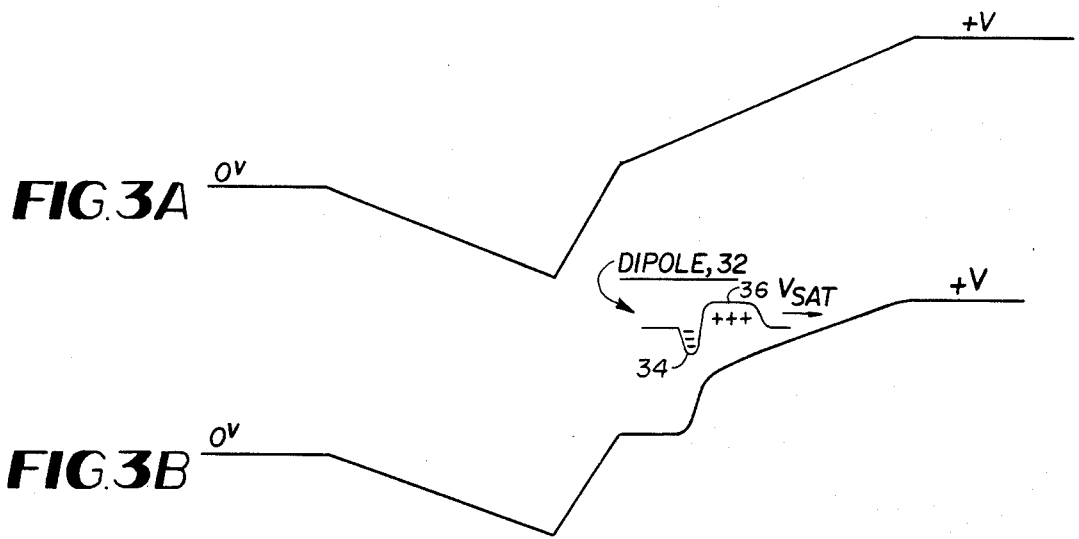
FIG.3A
FIG.3B

PLANAR DOPED BARRIER TRANSFERRED ELECTRON OSCILLATOR

ORIGIN OF THE INVENTION

The invention described herein may be manufactured and used by or for the Government for governmental purposes without the payment of any royalties thereon or therefor.

CROSS REFERENCE TO RELATED APPLICATIONS

This invention is related to the following applications which are assigned to the assignee of the present invention and which are herein meant to be incorporated by reference:

U.S. Ser. No. 246,787, entitled, "Planar Doped Barrier Semiconductor Device", filed on Mar. 23, 1981, in the name of Roger J. Malik, the present inventor and now issued as U.S. Pat. No. 4,410,902;

U.S. Ser. No. 300,406, entitled, "Planar Doped Barrier Transistor", filed on Sept. 8, 1981 in the names of Roger J. Malik, et al.; and U.S. Ser. No. 323,858 entitled, "Field Effect Transistor With Planar Doped Barrier Gate", filed on Nov. 23, 1981 in the names of Roger J. Malik, et al. and now U.S. Pat. No. 4,442,445.

BACKGROUND OF THE INVENTION

This invention relates to semiconductor devices and more particularly to solid state transferred electron devices.

Transferred electron devices are well known and are characterized by a device comprised of semiconductor material such as gallium arsenide (GaAs), a group III-V compound which has two valleys in its conduction band. When a high electric field is applied across such an element, electrons are transferred from the lower energy satellite valley to the higher energy satellite valley and because mobility of electrons in the higher energy valley is less than the mobility in the lower energy valley, the average speed of electrons decreases with an increase in electric field. When the intensity of the internal electric field applied from an outside source exceeds a critical value, a high field domain is created near the cathode, which is thereafter translated to the anode by the action of the applied electric field. When the high field domain reaches the anode, it disappears and an impulsive current is caused to flow through the semiconductor substance because of disappearance of the high field domain. Following this disappearance, a new high field domain is created near the cathode and the same sequence is repeated at a frequency determined by the length of the drift region over which the domain travels. For a more detailed treatment of the subject, reference may be made to chapter 11 entitled, "Transferred-Electron Devices" of the text *Physics of Semiconductor Devices*, 2nd edition, 1981 by Simon Sze, at pages 637-678, and published by Wiley-Interscience.

In a conventional n+-n-n+, transferred electron oscillator, which is also known as a Gunn diode, the voltage drop occurs primarily over the n region which is the drift region. In an effort to improve device performance, injection limited cathode contacts have been used instead of n+ ohmic contacts in order to provide a more uniform electric field. One known type of injection limited contact is a Schottky barrier, while the other is a two-zone cathode structure and is disclosed, for example, at pp. 667-670 of the aforementioned *Physics of Semiconductor Devices*. Notwithstanding the attempt to overcome the non-uniformity of the electric field in transferred electron devices, any variation in the doping of the drift region also alters the electric field causing degraded performance and reduction in the radio frequency (rf) conversion efficiency. Accordingly the difficulty of achieving abrupt doping profiles in conventional Gunn diodes leads to irreproducible and non-otpimized devices.

It is also known that Schottky barriers exhibit several inherent limitations, one being, for example, for a particular metal-semiconductor system, the barrier heights are virtually constant and operational stability is related to the metallurgy of the contact system. Furthermore, interface states in interfacial layers play a dominant role in determining the Schottky barrier transport properties which can lead to undesirable hysteresis effects, particularly in metal-GaAs structures. Attempts have been made in the past to modify the heights of Schottky barriers, however, such devices still exhibit relatively large barrier heights which necessitate the use of relatively high power.

Accordingly, it is an object of the present invention to provide an improvement in transferred electron devices.

Another object of the present invention is to provide a transferred electron oscillator having an improved electron injecting means.

A further object of the present invention is to provide an improved transferred electron oscillator having precise field and potential profiles.

And it is still a further object of the present invention to provide an improved transferred electron device including a planar doped barrier having a relatively low barrier height which is controllable.

SUMMARY

Briefly, these and other objects are accomplished by a transferred electron semiconductor device such as an oscillator formed from a Group III-V compound by an epitaxial growth process. The device comprises a body or substrate of semiconductor material on which is formed a drift region of semiconductor material having a doping density and a dimension selected to provide, upon the application of a biasing potential exceeding a predetermined threshold, a differential negative resistance due to the transferred electron effect, and electron injecting means consisting of a planar doped barrier region adjacent the drift region providing precise field potential profiles for controlling the injection of electrons into the drift region. Additionally, metallized ohmic contacts are applied on the outer surface of the substrate and the surface of the outermost layer of the planar doped barrier region for the application of energizing potentials.

BRIEF DESCRIPTION OF THE DRAWINGS

While the present invention is defined in the claims annexed to and forming a part of this specification, a better understanding can be had by reference to the following description taken in conjunction with the accompanying drawings in which:

FIG. 1 is a partial cross sectional view schematically illustrative of a planar doped barrier transferred electron oscillator in accordance with the preferred embodiment of the subject injection;

FIG. 2 is a diagram illustrative of the doping profile of the embodiment of the invention shown in FIG. 1;

FIG. 3A is a diagram illustrative of the potential profile of the embodiment shown in FIG. 1 under operating bias conditions; and FIG. 3B is a diagram illustrative of the potential profile of the embodiment shown in FIG. 1 following dipoled formation.

DESCRIPTION OF THE PREFERRED EMBODIMENTS

Molecular beam epitaxy (MBE) is a known but relatively new semiconductor growth technique which involves the use of selected molecular beams for condensation on a heated substrate in an ultra-high vacuum environment. This process has been disclosed, for example, in a publication entitled, "Structures Grown by Molecular Beam Epitaxy", L. L. Chang, et al., *J. Vac. Sci. Technol.*, Vol. 10, No. 5, September/October, 1973 at page 655. Due to the relatively slow growth rate and low substrate temperature, very precise epilayer thicknesses and abrupt doping profiles can be obtained.

The present invention is directed to a transferred electron device preferably fabricated by MBE techniques and concerns the deposition of n-type and p-type dopant atoms during a MBE growth process such that a precise density of dopant atoms is incorporated in extremely thin layers or planes ranging from a single atomic plane to several hundred angstroms (Å). The present invention, moreover, includes a planar doped barrier structure formed by MBE growth and comprises a plurality of selected highly doped thin layers of dopant atoms appropriately grown within a semiconductor body. In the aforementioned related application, U.S. Ser. No. 246,787, entitled, "Planar Doped Barrier Semiconductor Device", there is shown and described a planar doped barrier semiconductor structure having a n+-i-p+-i-n+ configuration wherein there is a narrow plane of acceptor atoms positioned between a pair of nominally undoped regions bounded by two heavily doped donor regions. By varying the acceptor charge density and the undoped (i) region widths, independent and continuous control of the barrier height is provided.

Referring now to the figures and more particularly to FIG. 1, reference numeral 10 denotes a substrate consisting of a Group III-V compound, preferably gallium arsenide, (GaAs) which is doped with n+ dopant atoms and which forms a portion of an anode structure for a transferred electron oscillator, commonly referred to as a Gunn diode. The oscillator includes a dipole drift region 12 consisting of a relatively low doped n type layer which is contiguous to an electron injection means or cathode structure consisting of a planar doped barrier electron injection region 14 and a metallized cathode contact 16. The dipole drift region 12 and the planar doped barrier region 14 are fabricated by molecular beam epitaxy (MBE) growth following the growth of an n+ buffer region layer 18 on the substrate 10. The buffer region 18 and the substrate 10 form the anode structure along with a metallized contact layer 20 formed on the bottom of the substrate 10.

The planar doped barrier injection region 14 comprises a n+-π-p+-π-n+ epilayered structure consisting of a relatively narrow highly doped p+ planar region 22 located between two relatively thicker π regions 24 and 26. The π regions comprise planar regions of very low doped p-type semiconductivity so that substantially undoped regions are provided. Exterior to the two π regions 24 and 26 are a pair of highly doped n+ planar regions 28 and 30. Thus what is provided is a structure wherein there is a narrow p+ plane of acceptor atoms positioned between a pair of substantially undoped π regions bounded by two heavily doped n+ donor regions, which by varying the acceptor charge density and the undoped region widths, independent and continuous control of the barrier height and control of the current-voltage characteristic is provided.

In operation, upon the application of a predetermined energizing potential across the ohmic contacts 16 and 20, the planar doped barrier injector region 14 operates to efficiently accelerate electrons such that they are transferred to a relatively high energy low mobility upper satellite valley where the electrons slow down due to their increase in effective mass. This phenomenon, known as the transferred electron effect, manifests itself as a negative differential resistance which is a known characteristic of certain Group III-V compounds which as noted above, includes GaAs. Once electrons have transferred to the upper satellite valley by the planar doped barrier region 14, they are injected into the drift region 12. A charge dipole is formed in the drift region 12 with a pile-up of electrons or negative charge at the trailing edge of the dipole and a deficiency of electrons or net positive charge at the leading edge of the dipole. The charge dipole then translates or drifts to the anode structure including the buffer region 18, the substrate 10 and the ohmic contact 20. This movement occurs at the saturation velocity which for GaAs is approximately $1.0 \times 10^7$ cm/sec. The frequency (f) of the oscillation for this mode of operation is transit time limited and can be expressed by the equation:

$$f = \frac{1}{t} = \frac{V_{sat}}{l} \text{ Hz} \tag{1}$$

where l is the length of the structure shown in FIG. 1, the width of the drift region 12. It can be seen, for example, that for a drift region dimension l of 1 micron (μm) operational frequencies in the range of 100 GHz can be provided.

What is significant, however, is that the planar doped barrier injection region 14 is adapted to provide a more uniform electric field and because it is capable of being designed to have a controlled and accordingly a relatively low barrier height as compared to a Schottky barrier, higher RF conversion efficiency is provided. In effect, the overall device can be improved since the critical device parameters can be accurately controlled. While the structure as shown in FIG. 1 has been described with respect to MBE growth in GaAs, the same structure can be realized, when desirable, by molecular beam epitaxy in indium phosphide (InP).

Furthermore, the structure shown in FIG. 1 comprises a mesa type of device wherein the planar doped barrier injection region 14 and the dipole drift region 12 are included in the mesa. This is easily formed by masking with a photoresist and etching to the n+ buffer region 18 in a well known manner. The structure could also be formed on a semi-insulating substrate with both contacts on the surface which would be amenable for monolithic integration.

In any event, the structure shown in FIG. 1 permits very high frequency operation since the planar doped barrier injection region very efficiently heats up the electrons into the upper valley before they are injected into the drift region 12. This is possible since potential drop across the short side of the injection region 14 occurs over distances less than 1000Å with a built in electric field in the order of $10^5$ volts/cm, in contrast to conventional Gunn oscillators having electrons accelerated at much lower fields in the order of $10^3$ volts/cm. and which require substantially longer times and distances.

Referring now to FIGS. 2 and 3A–3B, FIG. 2 is illustrative of the doping profile of the planar doped barrier transferred electron oscillator structure shown in FIG. 1 between the planar layers 18–28. It is significant to note the length 1 or width of the drift region 12 as well as the thicknesses $d_1$ and $d_2$ of the $\pi$ regions 24 and 26. The latter dimensions, moreover, determine the barrier height $\phi_B$ for electron injection region according to the following expression:

$$\phi_B = \phi_{BO} - \left(\frac{d_2}{d_1 d_2}\right) V \quad (2)$$

where $\phi_{BO}$ is the built-in barrier height for zero bias and V is the applied bias voltage across the planar doped barrier. The built-in barrier height $\theta_{BO}$ can be stated as:

$$\phi_{BO} = \frac{Q_p}{\epsilon_s}\left(\frac{d_1 d_2}{d_1 + d_2}\right) \quad (3)$$

where $\epsilon_s$ is the permitivity of the semiconductor, $Q_p$ is the space charge density in the p+ planar region 22, and $d_1$ and $d_2$ are the respective distances separating the p+ plane 22 from the upper n+ region 28 and the lower n+ region 30.

Accordingly, $\phi_B$ can be varied from zero to approximately the band gap of the semiconductor through appropriate choice of $Q_p$, $d_1$ and $d_2$. In the structure shown in FIG. 1, however, the planar doped barrier region 14 is designed to be slightly assymetric with the potential peak near the top contact 16 which serves as the cathode.

Referring now to FIGS. 3A and 3B, FIG. 3A is illustrative of the potential profile of the structure shown in FIG. 1 in relation to the doping profile of the device as shown in FIG. 2. This profile exists in response to a voltage +V applied to the anode ohmic contact 20 where the cathode ohmic contact 16 is at zero or ground potential. Furthermore, it is indicative of the voltage distribution across the structure before a nucleation of a charge dipole is formed in the drift region 12. FIG. 3B, on the other hand, is illustrative of the voltage across the structure with a fully formed dipole 32 formed in the drift region and including an accumulation region 34 and a depletion region 36 which moves through the drift region at the saturation velocity $V_{sat}$ until it is collected at the anode, at which time a new dipole nucleation process begins.

Thus what has been shown and described is a solid state transferred electron device grown by molecular beam epitaxy which is particularly adapted for use as an oscillator in microwave and millimeter wave applications where high frequency power sources for radar and communications are required.

Although the subject invention has been described with a certain degree of particularity, the foregoing has been made by way of illustration and not limitation. Accordingly, all modifications, alterations and changes coming within the spirit and scope of the invention as set forth in the appended claims are herein meant to be included.

I claim:

1. A transferred electron semiconductor device comprising, in combination:

an anode region including a substrate of a first conductivity type semiconductor material having a high dopant concentration and a buffer layer of said first conductivity type and high dopant concentration;

a drift region of semiconductor material of said first conductivity type having a relatively low dopant concentration formed on said anode region buffer layer, said drift region upon the application of an energizing potential of a predetermined magnitude having a differential negative resistance due to the transferred electron effect caused by a field induced transfer of conduction band electrons from a relatively low energy high mobility low satellite valley to a relatively higher energy low mobility upper satellite valley;

a cathode region including a planar doped barrier electron injection region contiguous to said drift region including a first layer of said first conductivity type of high dopant concentration, a second layer of substantially undoped semiconductor material on said first layer, a third relatively thin highly doped layer of a second conductivity type on said second layer, a fourth substantially undoped layer on said third layer, and a fifth highly doped layer of said first conductivity type on said fourth layer, said injection region establishing a controllable potential barrier and being operable to effect a transfer of electrons from said lower satellite valley to said upper satellite valley when said barrier is exceeded and thereafter inject said electrons into said drift region; and means for applying said energizing potential between said anode and said cathode regions.

2. The device as defined by claim 1 wherein said device is formed from gallium arsenide.

3. The device as defined by claim 1 wherein said device is formed from indium phosphide.

4. The device as defined by claim 1 including first and second ohmic contact means respectively formed on said fifth layer and said substrate for providing cathode and anode ohmic contacts for applying said energizing potential to said device.

5. The device as defined by claim 4 wherein said first conductivity type material includes an n-type dopant material, wherein said second conductivity type material includes a p-type dopant material and wherein said substantially undoped material includes a very low doped p-type material.

6. The device as defined by claim 4 wherein said substrate is comprised of n+ type semiconductor material, said dipole drift region comprises n-type semiconductor material and said planar doped barrier region comprises an n+-$\pi$-p+-$\pi$-n+ multilayered structure.

7. The device as defined by claim 6 wherein the thicknesses of said two $\pi$ layers are selectively controlled for determining the barrier height of electron injection into the drift region.

8. The device as defined by claim 6 wherein said $\pi$ type and n+ type layers intermediate the n type drift region and the p+ type region is in the order of 1000 Å or less.

9. The device is defined by claim 1 wherein said drift region and first, second, third, fourth and fifth layers are arranged in a mesa structure on said buffer layer.

* * * * *